(12) United States Patent
Sung et al.

(10) Patent No.: US 12,405,226 B2
(45) Date of Patent: Sep. 2, 2025

(54) SUBSTRATE INSPECTION APPARATUS AND SUBSTRATE INSPECTION METHOD

(71) Applicant: Samsung Electronics Co., Ltd., Suwon-si (KR)

(72) Inventors: Jangwoon Sung, Suwon-si (KR); Lei Tian, Boston, MA (US); Hao Wang, Boston, MA (US); Jiabei Zhu, Boston, MA (US); Myungjun Lee, Suwon-si (KR); Wookrae Kim, Suwon-si (KR); Seungbeom Park, Suwon-si (KR); Junho Shin, Suwon-si (KR); Hojun Lee, Suwon-si (KR)

(73) Assignees: SAMSUNG ELECTRONICS CO., LTD., Gyeonggi-Do (KR); TRUSTEES OF BOSTON UNIVERSITY, Boston, MA (US)

( * ) Notice: Subject to any disclaimer, the term of this patent is extended or adjusted under 35 U.S.C. 154(b) by 134 days.

(21) Appl. No.: 18/493,226

(22) Filed: Oct. 24, 2023

(65) Prior Publication Data

US 2024/0219315 A1 Jul. 4, 2024

(30) Foreign Application Priority Data

Jan. 3, 2023 (KR) .................. 10-2023-0000481

(51) Int. Cl.
*G01N 21/95* (2006.01)
*G01N 21/88* (2006.01)
(Continued)

(52) U.S. Cl.
CPC ..... *G01N 21/9501* (2013.01); *G01N 21/8806* (2013.01); *G01N 21/956* (2013.01);
(Continued)

(58) Field of Classification Search
CPC .......... G01N 21/9501; G01N 21/8806; G01N 21/956; G03F 7/70633; G03F 7/706837;
(Continued)

(56) References Cited

U.S. PATENT DOCUMENTS 7,065,737 B2 6/2006 Phan et al.
10,048,132 B2 8/2018 Hill et al.
(Continued)

FOREIGN PATENT DOCUMENTS

KR 20220104821 A 7/2022
WO 2014070656 A1 5/2014

*Primary Examiner* — Georgia Y Epps
*Assistant Examiner* — Erin R Garber
(74) *Attorney, Agent, or Firm* — Wolf, Greenfield & Sacks, P.C.

(57) ABSTRACT

A substrate inspection apparatus includes a light irradiator including an objective lens and a plurality of optical fibers. The objective lens is configured to irradiate light to an illumination area on a semiconductor substrate having a plurality of circuit pattern layers, the plurality of optical fibers are adjacent a periphery of the objective lens and are configured to irradiate the light to a peripheral area adjacent the illumination area. A light generator is configured to generate the light. The light generator is configured to change an irradiation angle of the light to selectively irradiate the light to one or more of the objective lens and the plurality of optical fibers. A light analyzer is configured to obtain images of the circuit pattern layers from the light reflected from the illumination area and the peripheral area. The light analyzer is configured to model each of the circuit pattern layers of the semiconductor substrate to obtain image models and to measure an overlay between the circuit pattern layers through the images and the image models.

20 Claims, 8 Drawing Sheets

(51) Int. Cl.
*G01N 21/956* (2006.01)
*G03F 7/00* (2006.01)
*H01L 21/66* (2006.01)
*G01B 11/27* (2006.01)

(52) U.S. Cl.
CPC .......... *G03F 7/70633* (2013.01); *H01L 22/12* (2013.01); *G01B 11/27* (2013.01); *G03F 7/706837* (2023.05); *G03F 7/706847* (2023.05); *G03F 7/706849* (2023.05)

(58) Field of Classification Search
CPC ......... G03F 7/706847; G03F 7/706849; G03F 7/70616; G01B 11/27; H01L 22/12
See application file for complete search history.

(56) References Cited

U.S. PATENT DOCUMENTS

| | | |
|---|---|---|
| 10,089,733 B2 | 10/2018 | Seidel |
| 10,386,297 B2 | 8/2019 | Blumrich et al. |
| 10,665,001 B2 | 5/2020 | Horstmeyer et al. |
| 10,788,748 B2 | 9/2020 | Thaler et al. |
| 10,955,353 B2 | 3/2021 | Den Boef et al. |
| 2015/0116717 A1* | 4/2015 | Manassen ............... G01B 11/00 356/445 |
| 2021/0116694 A1* | 4/2021 | Durand De Gevigney ................. G02B 21/084 |
| 2022/0074867 A1* | 3/2022 | Jung ....................... H01L 22/12 |
| 2022/0254538 A1 | 8/2022 | Zheng et al. |
| 2022/0413276 A1 | 12/2022 | Anderson et al. |
| 2024/0301585 A1* | 9/2024 | Miyase ................... C30B 25/20 |

* cited by examiner

SUBSTRATE INSPECTION APPARATUS AND SUBSTRATE INSPECTION METHOD

PRIORITY STATEMENT

This application claims priority under 35 U.S.C. § 119 to Korean Patent Application No. 10-2023-0000481, filed on Jan. 3, 2023, in the Korean Intellectual Property Office (KIPO), the contents of which are herein incorporated by reference in their entirety.

BACKGROUND

1. Field

Example embodiments relate to a substrate inspection apparatus and substrate inspection method. More particularly, example embodiments relate to a substrate inspection apparatus configured to inspect an overlay between a plurality of circuit pattern layers of a semiconductor substrate and a method of inspecting the semiconductor substrate.

2. Description of the Related Art

An overlay may be measured to determine a reliability of a semiconductor substrate. The overlay may refer to a degree of vertical alignment between circuit patterns. In an image based measurement method and a diffraction based measurement method, data that can be obtained from each circuit patter layer may decrease from an upper circuit pattern layer to a lower circuit pattern layer, and only overlay between adjacent circuit pattern layers may be measured. In order to measure the overlay between a plurality of circuit pattern layers, a different overlay key may be required for each layer, and measurement time and measurement cost may increase.

SUMMARY

Example embodiments provide a substrate inspection apparatus configured to simultaneously measure overlay between a plurality of circuit pattern layers.

Example embodiments provide a method of inspecting a substrate using the substrate inspection apparatus.

According to example embodiments, a substrate inspection apparatus includes a light irradiator including an objective lens and a plurality of optical fibers. The objective lens is configured to irradiate light to an illumination area on a semiconductor substrate having a plurality of circuit pattern layers, and the plurality of optical fibers are adjacent a perimeter of the objective lens and are configured to irradiate the light to a peripheral area surrounding the illumination area. A light generator is configured to generate the light, and the light generator is configured to change an irradiation angle of the light to selectively irradiate the light to one or more of the objective lens and the plurality of optical fibers. A light analyzer is configured to obtain images of the plurality of circuit pattern layers from the light reflected from the illumination area and the peripheral area, and the light analyzer is configured to model each of the plurality of circuit pattern layers of the semiconductor substrate to obtain image models and to measure and overlay between the plurality of circuit pattern layers with the images and the image models.

According to example embodiments, a substrate inspection apparatus includes a spatial light modulator configured to generate light while changing an irradiation angle. An objective lens is configured to irradiate the light to an illumination area onto a semiconductor substrate that has a plurality of circuit pattern layers. A plurality of optical fibers are adjacent a perimeter of the objective lens and are configured to irradiate the light to a peripheral area surrounding the illumination area. A reflection mirror is configured to reflect the light generated from the light generator to the objective lens or the plurality of optical fibers according to the irradiation angle. A light analyzer is configured to obtain images of the plurality of circuit pattern layers from the light reflected from the illumination area and the peripheral area.

According to example embodiments, a substrate inspection apparatus includes a light generator configured to generate light while changing an irradiation angle to measure an overlay of a semiconductor substrate that has a plurality of circuit pattern layers and a light irradiator including an objective lens and a plurality of optical fibers. The objective lens is configured to irradiate the light to an illumination area onto the semiconductor substrate, and the plurality of optical fibers are adjacent a perimeter of the objective lens and are configured to irradiate the light to a peripheral area surrounding the illumination area. A reflection mirror is configured to reflect the light generated from the light generator to the objective lens or the plurality of optical fibers according to the irradiation angle, an optical lens is between the light generator and the reflection mirror and configured to focus the light generated from the light generator on the reflection mirror. A light analyzer is configured to obtain images of the plurality of circuit pattern layers from the light reflected from the illumination area and the peripheral area, the light analyzer is configured to model each of the plurality of circuit pattern layers of the semiconductor substrate to calculate image models, and the light analyzer is configured to measure the overlay through the images and the image models.

According to example embodiments, in a method of inspecting a substrate, a plurality of circuit pattern layers of a semiconductor substrate are modeled to obtain image models. Light is irradiated to an illumination area within a numerical aperture of an objective lens onto the semiconductor substrate. The light is irradiated to a peripheral area adjacent a perimeter of illumination area onto the semiconductor substrate. Images of the plurality of circuit pattern layers are obtained from the light reflected from the illumination area and the peripheral area. An overlay between the plurality of circuit pattern layers is measured through the images and the image models.

According to example embodiments, a substrate inspection apparatus may include a light irradiator including an objective lens and a plurality of optical fibers. The objective lens is configured to irradiate light to an illumination area on a semiconductor substrate having a plurality of circuit pattern layers, and the plurality of optical fibers are adjacent a perimeter of the objective lens and are configured to irradiate the light to a peripheral area surrounding the illumination area. A light generator is configured to generate the light and to change an irradiation angle of the light to selectively irradiate the light to one or more of the objective lens and the plurality of optical fibers. A light analyzer is configured to obtain images of the plurality of circuit pattern layers from the light reflected from the illumination area and the peripheral area, and the light analyzer is configured to model each of the plurality of circuit pattern layers of the semiconductor substrate to obtain image models and to measure an overlay between the plurality of circuit pattern layers through the images and the image models.

Thus, the light generator may change the irradiation angle to selectively irradiate the light to one or more of the objective lens and the optical fibers of the light irradiator. The illumination area may be a bright field having a high light intensity. The peripheral area may be a dark field having a low light intensity. The light analyzer may collect the light reflected from the illumination area and the light reflected from the peripheral area. The light analyzer may increase accuracy of the images through the light reflected from the illumination area and the light reflected from the peripheral area. The light analyzer may obtain the images having high resolution in the illumination area and the peripheral area through the objective lens and the optical fibers of the light irradiator.

Also, the light analyzer may model each of the plurality of circuit pattern layers to calculate the image models. The light analyzer may calculate a change between the images and the image models to measure the overlay. The light analyzer may simultaneously measure the overlay between the circuit pattern layers through the images having the high resolution. The light analyzer may accurately measure the overlay in a short time through the images and the image models.

BRIEF DESCRIPTION OF THE DRAWINGS

Example embodiments will be more clearly understood from the following detailed description taken in conjunction with the accompanying drawings.

FIG. 1 a view illustrating a substrate inspection apparatus in accordance with example embodiments.

FIG. 2 is a perspective view illustrating a light irradiator in FIG. 1.

FIG. 3 is a view illustrating an illumination area and a peripheral area.

FIGS. 4 to 8 are views illustrating a method of inspecting a substrate using the substrate inspection apparatus in FIG. 1.

DETAILED DESCRIPTION OF EXAMPLE EMBODIMENTS

Hereinafter, example embodiments will be explained in detail with reference to the accompanying drawings.

Figure 1:
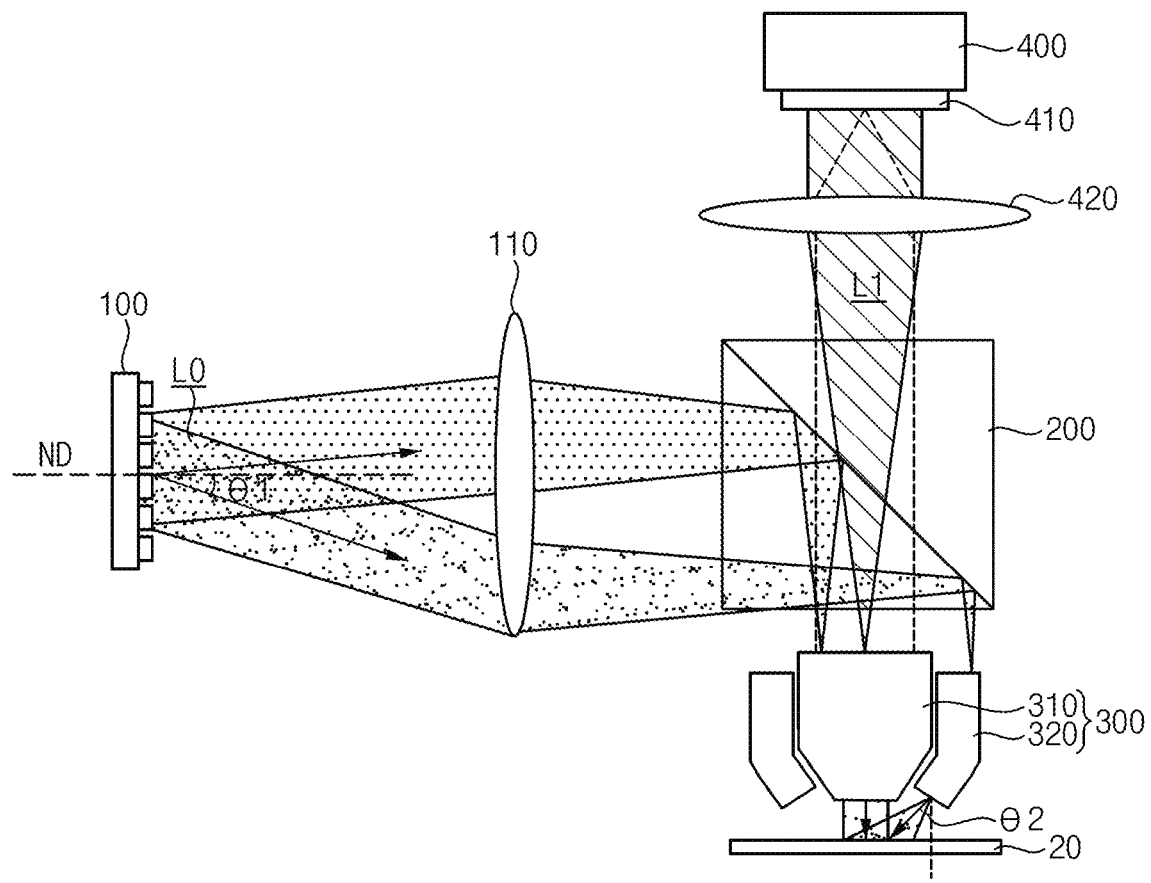
FIGS. 1 to 8 represent non-limiting, example embodiments as described herein.
Figure 2:
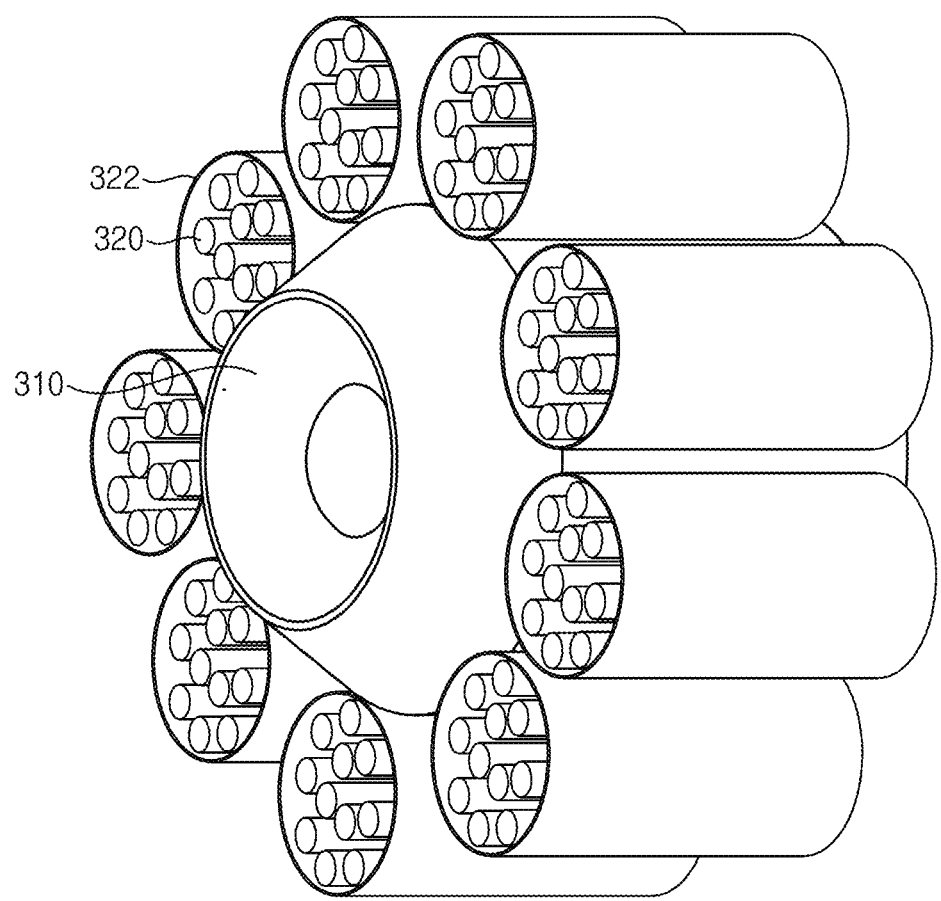
Figure 3:
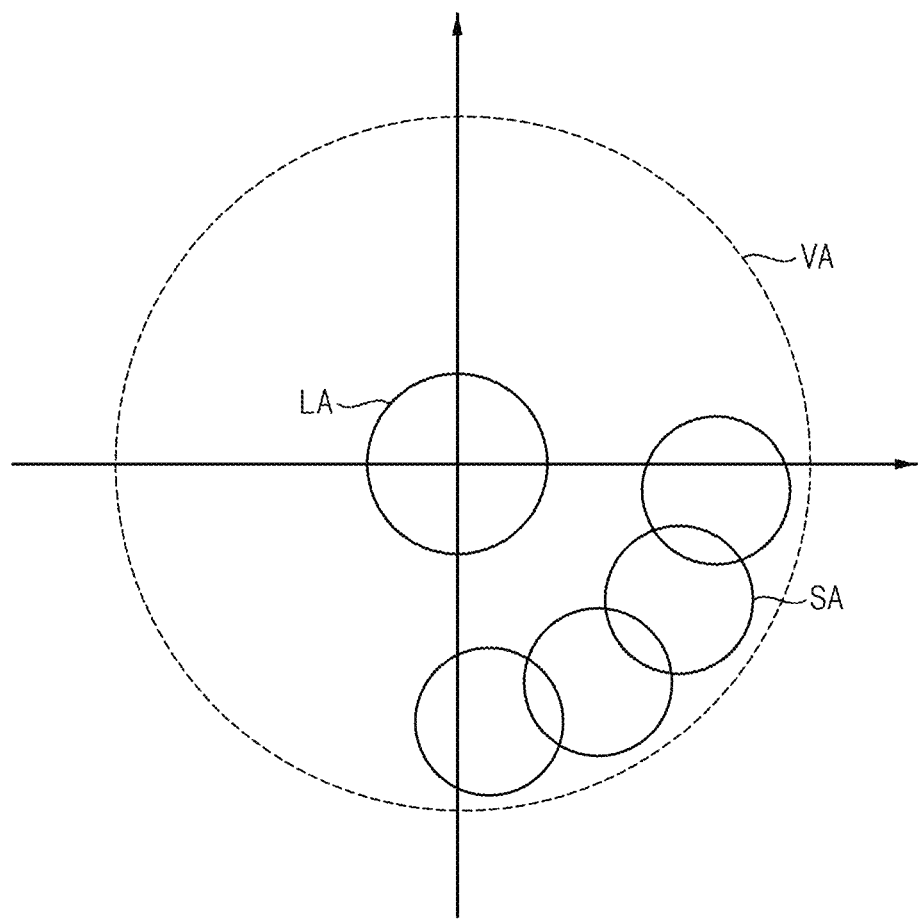

FIG. 1 a view illustrating a substrate inspection apparatus in accordance with example embodiments. FIG. 2 is a perspective view illustrating a light irradiator in FIG. 1. FIG. 3 is a view illustrating an illumination area and a peripheral area.

Referring to FIGS. 1 to 3, a substrate inspection apparatus 10 may include a light generator 100 configured to generate light L0 configured for measuring an overlay of a semiconductor substrate 20, a light irradiator 300 having an objective lens 310 and a plurality of optical fibers 320 and irradiating the light L0 onto the semiconductor substrate 20, and a light analyzer 400 configured to measure the overlay of the semiconductor substrate 20 through light L1 that is reflected from the semiconductor substrate 20.

In example embodiments, the substrate inspection apparatus 10 may be a device configured to measure the overlay between a plurality of circuit pattern layers of the semiconductor substrate 20. The substrate inspection apparatus 10 may measure the overlay through a Fourier ptychography method. The Fourier typography method may utilize a system configured to form a plurality of lights to overlap onto an object. The substrate inspection apparatus 10 may increase a resolution of the object using the Fourier typography method.

Each of the circuit pattern layers may include a plurality of insulating layers, and a plurality of circuit patterns within the insulating layers. The overlay may be a degree of vertical alignment between the circuit patterns. The substrate inspection apparatus 10 may measure the overlay between the plurality of circuit patterns. The substrate inspection apparatus 10 may measure the overlay to determine reliability of the semiconductor substrate.

In example embodiments, the light generator 100 may generate the light L0 configured to measure the overlay of the semiconductor substrate 20. The light generator 100 may change an irradiation angle $\theta 1$ of the light L0. The light generator 100 may change the irradiation angle of the light L0 to transmit the light L0 onto the light irradiator 300. The light generator 100 may change the irradiation angle $\theta 1$ to selectively transmit the light L0 to one or more of the objective lens 310 and the optical fibers 320. For example, the irradiation angle $\theta 1$ from a horizontal direction may be within a range of 5 degrees to 25 degrees. The horizontal direction may be a normal direction ND orthogonal to a surface from which a light source is emitted.

The light generator 100 may include various types of light generating device(s) configured to change the irradiation angle and irradiating the light L0. For example, the light generating device may include a spatial light modulator (SLM), an LED array, and a digital micro mirror device.

The substrate inspection apparatus 10 may further include a reflection mirror 200 configured to reflect the light L0 that is generated from the light generator 100 to the light irradiator 300. The reflection mirror 200 may be between the light generator 100 and the light irradiator 300. The reflection mirror 200 may reflect the light L0 according to the irradiation angle of the light generator 100. The reflection mirror 200 may selectively reflect the light L0 toward at least one of the objective lens 310 and the optical fibers 320. For example, the reflection mirror 200 may reflect the light L0 irradiated in the horizontal direction from the light generator 100 in a vertical direction. The vertical direction may be a direction perpendicular to a surface of the semiconductor substrate. The vertical direction may be the same direction as a thickness direction of the semiconductor substrate.

The reflection mirror 200 may include a beam splitter. The reflection mirror 200 may reflect at least portion of the light L0 through a reflective surface of the beam splitter, and the reflection mirror 200 may transmit another portion of the light L0 to the reflective surface of the beam splitter. The reflection mirror 200 may include a transmissive reflective mirror. The reflection mirror 200 may transmit the light L0 generated from the light generator 100 to the light irradiator 300, and the reflection mirror 200 may transmit the light L1 reflected from the semiconductor substrate 20 to the light analyzer 400.

The substrate inspection apparatus 10 may further include a first optical lens 110 configured to form (e.g., to collimate) the light L0 generated from the light generator 100 onto the reflection mirror 200. Alternatively, the first optical lens 110 may directly image the light L0 generated from the light generator 100 onto the light irradiator 300. The first optical lens 110 may control a direction of the light L0 generated from the light generator 100 such that the light L0 is irradiated onto the reflection mirror 200 or the light irradiator 300. For example, the first optical lens 110 may include a collimator lens.

In example embodiments, the light irradiator 300 may irradiate the light L0 generated from the light generator 100 onto the semiconductor substrate 20. The light irradiator 300 may include the objective lens 310, and the plurality of optical fibers 320 surrounding the objective lens 310. That is, the plurality of optical fibers may be adjacent a perimeter of the objective lens 310. The objective lens 310 may directly receive the light L0 from the light generator 100. The objective lens 310 may receive the light L0 from the light generator 100 through the reflection mirror 200.

As illustrated in FIG. 3, the objective lens 310 may form an illumination area LA onto the semiconductor substrate 20. The illumination area LA may include a point on which a focus of the objective lens 310 is formed. The objective lens 310 may have a viewing area VA on which a field of view is secured on the semiconductor substrate 20. The illumination area LA may be formed onto a center of the viewing area VA. The objective lens 310 may form images of the plurality of circuit pattern layers within the lighting area LA.

The objective lens 310 may include a pupil configured to adjust an amount of light. The objective lens 310 may irradiate the light L0 to the illumination area LA onto the semiconductor substrate 20 through the pupil. The illumination area may be a bright field having a high light intensity.

The light L0 passing through the objective lens 310 may be reflected from the circuit pattern layers of the semiconductor substrate 20 to form first reflected light. The first reflected light may be collected by the light analyzer 400 through the objective lens 310.

The objective lens 310 may have a low numerical aperture (NA). The objective lens 310 may reduce a size of the image through the low numerical aperture. The objective lens 310 may obtain the light L1 reflected in a wider area from the semiconductor substrate 20 through the low numerical aperture. The objective lens 310 may widen the viewing area VA through the low numerical aperture. The objective lens 310 may widen the illumination area LA of the semiconductor substrate 20 through the low numerical aperture. For example, the numerical aperture may be within a range of 0.1 to 0.3.

The plurality of optical fibers 320 may be along an outer surface of the objective lens 310. The plurality of optical fibers 320 may form one bundle by a plurality of light blocking layers 322. The plurality of light blocking layers 322 in which the plurality of optical fibers 320 are bundled may be along the outer surface of the objective lens 310.

The plurality of optical fibers 320 may irradiate the light L0 transmitted from the light generator 100 onto a peripheral area SA that is adjacent (e.g., that surrounds) the illumination area LA. The peripheral area SA may be formed in a periphery of the viewing area VA, e.g., adjacent the perimeter of the viewing area VA. Since the plurality of optical fibers 320 adjacent a perimeter of the objective lens 310 (e.g., to surround the objective lens 310), the light L0 may be irradiated onto all areas of the peripheral area SA around or surrounding the illumination area LA. The images of the plurality of circuit pattern layers may be formed in the peripheral area SA.

The peripheral area SA may be an area in which the light L0 is not sufficiently transmitted through the pupil of the objective lens 310. The peripheral area SA may be a dark field having low light intensity. The plurality of optical fibers 320 may irradiate the light onto the peripheral area SA to increase a resolution of the plurality of circuit pattern layers located in the peripheral area SA.

The light L0 passing through the optical fibers 320 may be reflected from the circuit pattern layers of the semiconductor substrate 20 to form second reflected light. The second reflected light may be collected by the light analyzer 400 through the objective lens 310.

The optical fibers 320 may irradiate the light L0 onto the semiconductor substrate 20 at a predetermined angle θ2 from the vertical direction. The optical fibers 320 may irradiate the light at the predetermined angle θ2 to irradiate the light L0 onto a wider area on the peripheral area. For example, the predetermined angle from the vertical direction may be within a range of 10 degrees to 50 degrees.

In example embodiments, the light analyzer 400 may obtain photographic images of the circuit pattern layers from the light L1 that is reflected from the semiconductor substrate 20. The light analyzer 400 may include a photographing sensor 410 configured to sense or obtain the light L1 reflected from the semiconductor substrate 20. The light analyzer 400 may obtain or receive the light L1 passing through the objective lens 310 through the photographing sensor 410.

The light analyzer 400 may collect the first reflected light reflected from the illumination area and the second reflected light reflected from the peripheral area. The light analyzer 400 may obtain the photographic images of the circuit pattern layers through the first and second reflected lights.

The light analyzer 400 may obtain an amplitude and a phase from each of the first and second reflected lights reflected from the illumination area and the peripheral area. The light analyzer 400 may obtain the photographic images of the circuit pattern layers through the amplitude and the phase, respectively.

The photographic images may have a three-dimensional (3D) profile of each of the plurality of circuit pattern layers. The light analyzer 400 may calculate the three-dimensional profile based on the light L0 incident from the vertical direction onto the semiconductor substrate 20 through the objective lens 310 and the light L0 incident at the predetermined angle from the vertical direction onto the semiconductor substrate 20 through the optical fibers 320. The light analyzer 400 may recognize the circuit pattern layers of the semiconductor substrate 20 in a 3D space through the three-dimensional profile.

The light analyzer 400 may measure heights between the respective circuit pattern layers from the first and second reflected lights. The light analyzer 400 may measure the heights between the respective circuit pattern layers based on the light L0 incident onto the semiconductor substrate 20 from the vertical direction through the objective lens 310 and the light L0 incident onto the semiconductor substrate 20 at the predetermined angle from the vertical direction through the optical fibers 320. The light analyzer 400 may obtain the photographic images through the heights.

The light analyzer 400 may model each of the circuit pattern layers of the semiconductor substrate 20 to calculate image models. The image model may include a multi-slice beam propagation model (MS-BPM) of each of the circuit pattern layers. The image model may be formed through image simulation that is performed in the 3D space. The image model may vary according to a type of semiconductor substrate 20.

The light analyzer 400 may measure the overlay through the photographic images and the image models. The light analyzer 400 may calculate a change (gradient) between the photographic images and the image models. The change may be an error value between the photographic images and the image models. The light analyzer 400 may calculate the change through repeated comparison simulations. The light analyzer 400 may calculate the change of each of the circuit pattern layers of the semiconductor substrate 20.

The light analyzer 400 may measure the overlay between the circuit pattern layers through a gradient descent method based on the gradient. The gradient descent method may include an optimization algorithm configured to obtain the error value between the photographic images and the image models. The gradient descent method may include an algorithm configured to repeatedly obtain an approximate value of the gradient through the repeated comparison simulations. The light analyzer 400 may obtain an extreme value of the approximate value through the gradient descent method to measure the overlay.

In example embodiments, the substrate inspection apparatus 10 may further include a second optical lens 420 configured to form an image of the light L1 reflected from the semiconductor substrate 20 onto the photographing sensor 410. The second optical lens 420 may control a direction of the reflected light L1 such that the light L1 reflected from the semiconductor substrate 20 is irradiated onto the photographing sensor 410. For example, the second optical lens 420 may include the collimator lens.

As describe above, the light generator 100 may change the irradiation angle to selectively irradiate the light L0 to one or more of the objective lens 310 and the optical fibers 320 of the light irradiator 300. The illumination area LA may be the bright field having the high light intensity. The peripheral area SA may be the dark field having the low light intensity. The light analyzer 400 may collect the first reflected light reflected from the illumination area LA and the second reflected light reflected from the peripheral area SA to each other. The light analyzer 400 may increase accuracy of the photographic images through the first reflected light reflected from the illumination area LA and the second reflected light reflected from the peripheral area SA. The light analyzer 400 may obtain the photographic images having high resolution in the illumination area LA and the peripheral area SA through the objective lens 310 and the optical fibers 320 of the light irradiator 300.

Also, the light analyzer 400 may model each of the circuit pattern layers to calculate the image models. The light analyzer 400 may calculate the change between the photographic images and the image models to measure the overlay. The light analyzer 400 may simultaneously measure the overlay between the circuit pattern layers through the photographic images having the high resolution. The light analyzer 400 may accurately measure the overlay in a short time through the photographic images and the image models.

Hereinafter, a method of inspecting a substrate using the substrate inspection apparatus in FIG. 1 will be described in detail.

Figure 4:
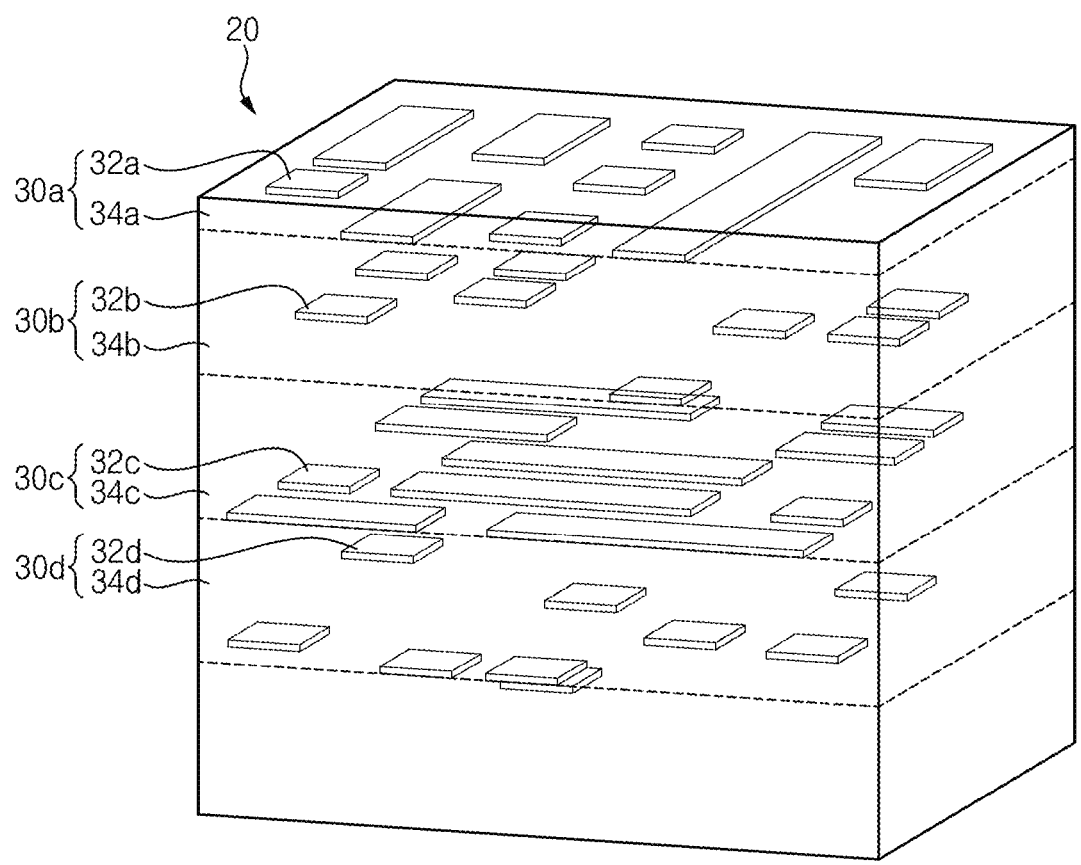
Figure 5:
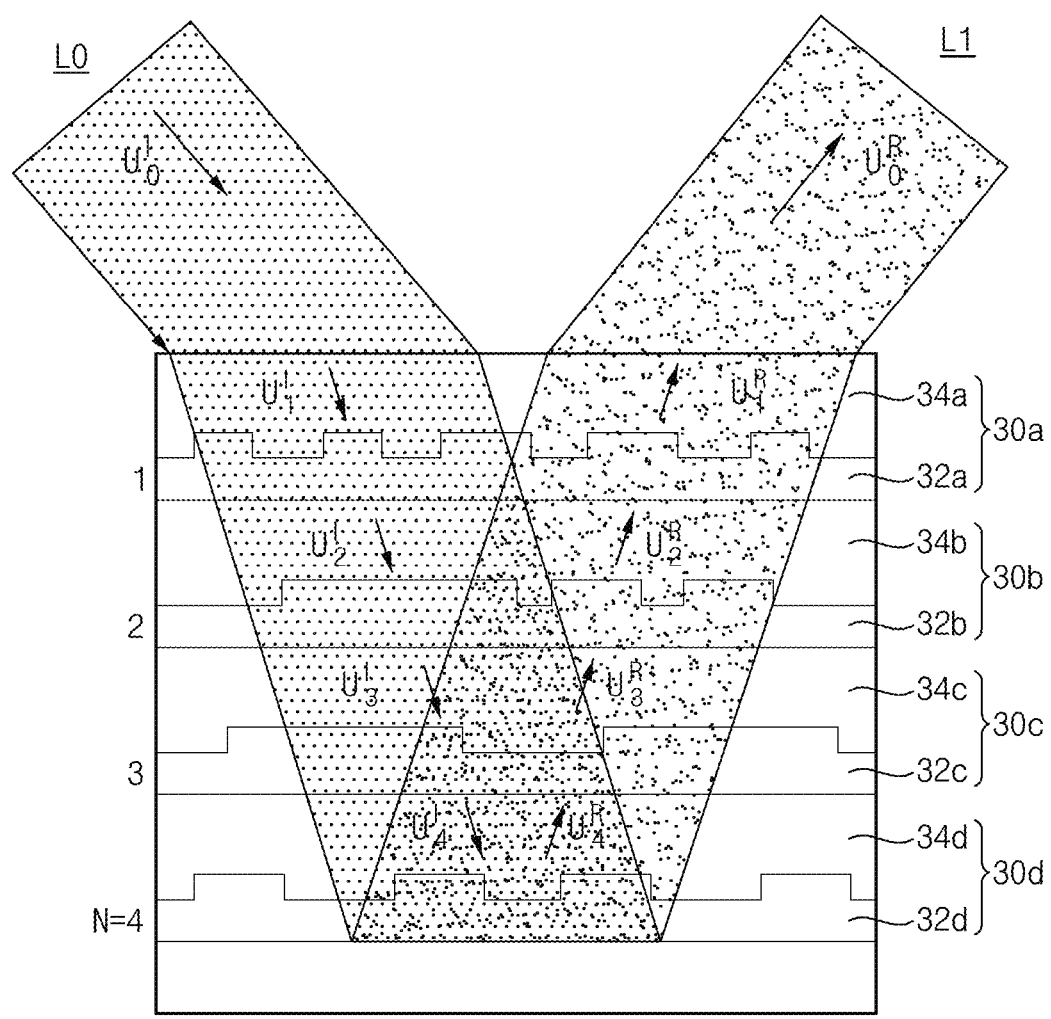
Figure 6:
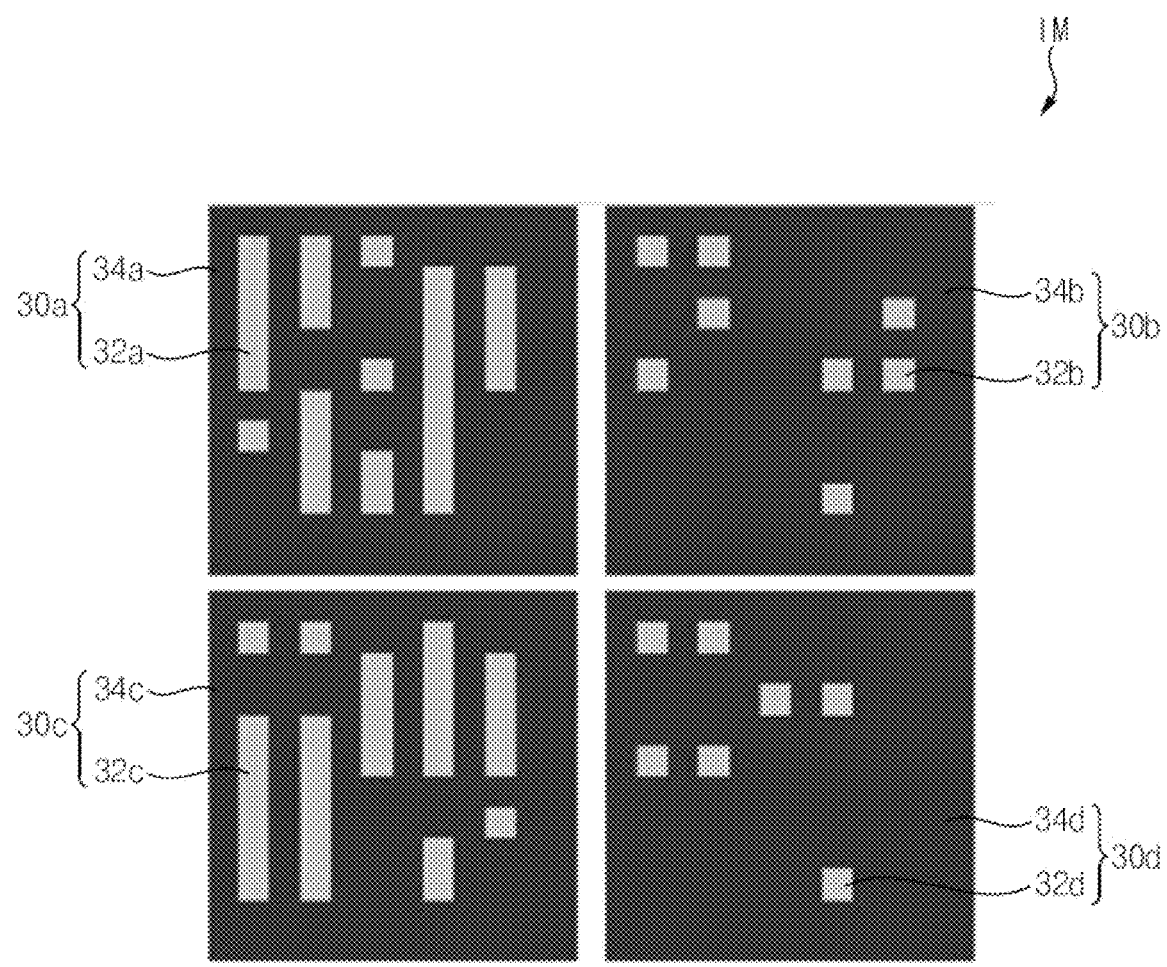

FIGS. 4 to 8 are views illustrating a method of inspecting a substrate using the substrate inspection apparatus in FIG. 1. FIG. 4 is a perspective view illustrating a semiconductor substrate having a plurality of circuit pattern layers. FIG. 5 is a view illustrating a process of modeling of a plurality of circuit pattern layers to obtain image models. FIG. 6 is a view illustrating image models of a plurality of circuit pattern layers.

Referring to FIGS. 1 and 4 to 6, first, a plurality of circuit pattern layers 30 may be modeled to obtain image models IM, respectively.

In example embodiments, as illustrated in FIG. 4, a semiconductor substrate 20 may include the plurality of circuit pattern layers 30. The plurality of circuit pattern layers 30 may include first to fourth circuit pattern layers 30a, 30b, 30c, and 30d.

The first to fourth circuit pattern layers 30a, 30b, 30c, and 30d may include first to fourth insulating layers 34a, 34b, 34c, and 34d, and first to fourth circuit patterns 32a, 32b, 32c, and 32d in the first to fourth insulating layers, respectively. The first to fourth insulating layers may include a polymer or a dielectric layer. The first to fourth circuit patterns may include aluminum (Al), copper (Cu), tin (Sn), nickel (Ni), gold (Au), platinum (Pt), or an alloy thereof.

In this specification, the semiconductor substrate 20 is illustrated as having four circuit pattern layers, however, it will be appreciated that the number of circuit patterns is not limited thereto.

As illustrated in FIG. 5, the first to fourth circuit pattern layers 30a, 30b, 30c, and 30d of the semiconductor substrate 20 may be modeled to calculate the image models IM. The image models IM may be calculated through incident areas and reflection areas of light that is irradiated onto the semiconductor substrate 20. The image models IM may be calculated through the incident areas and the reflection areas of the light passing through each of the first to fourth circuit patterns 32a, 32b, 32c, and 32d.

A first incident area of the light irradiated onto the first circuit pattern layer (uppermost circuit pattern layer) may be defined by following Equation (1), and an incident area of the light irradiated onto a L-th circuit pattern layer may be defined by following Equation (2).

$$U_0^I \qquad \text{Equation (1)}$$

$$U_L^I = e^{i\Delta\phi_L}\left(e^{ikn_0\Delta z}U_{L-1}^I\right) \qquad \text{Equation (2)}$$

Here, L is the number of circuit pattern layers, i is a complex number, $\Delta\phi_L$ is a phase change of the light in the L-th circuit pattern layer, k is a proportionality constant, no is an ambient refractive index, $\Delta z$ is a height of the circuit pattern layer.

The reflection area of the light reflected onto the circuit pattern layer 30 of the L-th circuit pattern layer may be defined by following Equations (3) and (4).

$$U_N^R = -conj(U_N^I) \qquad \text{Equation (3)}$$

$$U_L^R = e^{-i\Delta\phi_L}\left(e^{-ikn_0\Delta z}U_{L-1}^R\right) \qquad \text{Equation (4)}$$

Here, L is the number of the circuit pattern layers, i is the complex number, $\Delta\phi L$ is the phase change of the light in the L-th circuit pattern layer, k is the proportionality constant, no is the ambient refractive index, $\Delta z$ is the height of the circuit pattern layer.

As illustrated in FIG. 6, the image models of the first to fourth circuit pattern layers 30a, 30b, 30c, and 30d may be calculated. The image models may include positions of the first to fourth circuit patterns 32a, 32b, 32c, and 32d of the first to fourth circuit pattern layers 30a, 30b, 30c, and 30d, respectively. For example, the image model may include a multi-slice beam propagation model (MS-BPM) of each of the circuit pattern layers.

Figure 7:
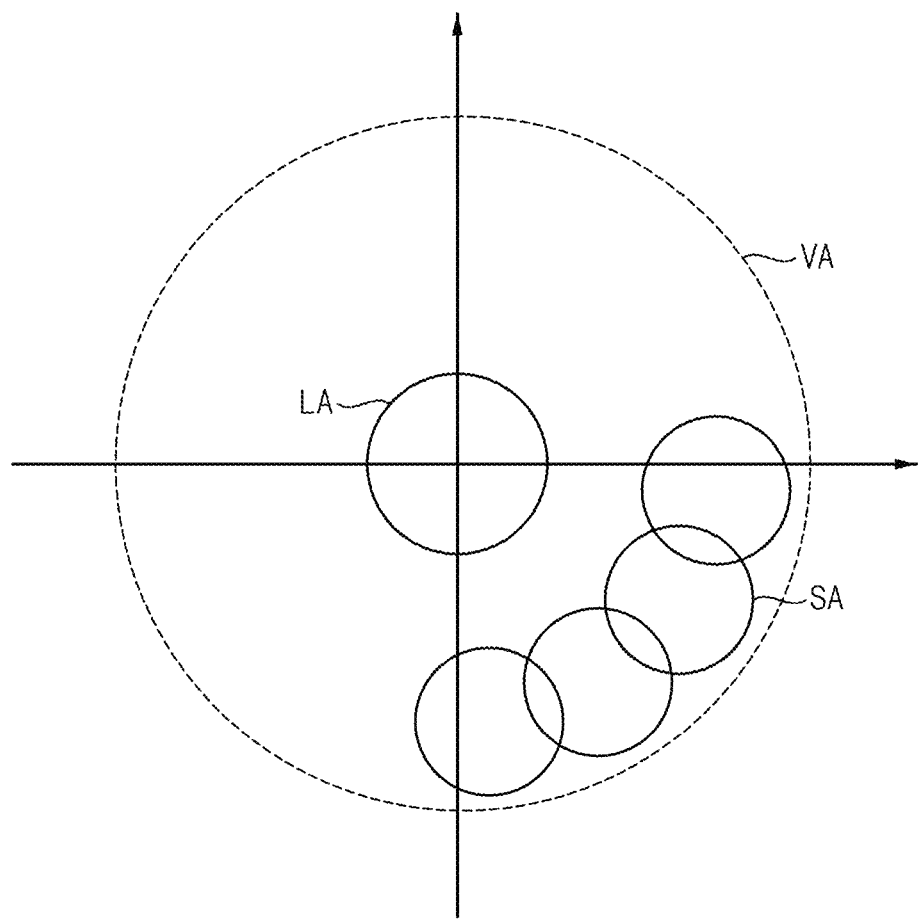

FIG. 7 is a view illustrating an illumination area and a peripheral area.

Referring to FIGS. 1 and 7, then, the light may be irradiated to an illumination area LA onto the semiconductor substrate 20 through an objective lens 310, and the light may be irradiated to a peripheral area SA adjacent a perimeter of or surrounding the illumination area LA onto the semiconductor substrate 20. The objective lens 310 may have a viewing area VA in which a field of view is secured on the semiconductor substrate 20. The illumination area LA may be formed in a center of the viewing area VA.

The light may be irradiated onto the illumination area LA in a vertical direction. The light may be incident onto the peripheral area SA at a predetermined angle from the vertical direction. The light may be reflected from the circuit pattern layers 30 of the semiconductor substrate 20. The light reflected from the illumination area LA may form first reflected light. The light reflected from the peripheral area SA may form second reflected light.

The illumination area LA may be formed within a numerical aperture (NA) of the objective lens 310. The illumination area LA may include a point on which a focus of the objective lens 310 is formed. The objective lens 310 may have the viewing area VA in which the field of the view is secured on the semiconductor substrate 20. The illumination area LA may be formed in the center of the viewing area VA. The illumination area may be a bright field having a high light intensity.

The peripheral area SA may be formed in a periphery of the viewing area VA. The peripheral area SA may be an area in which the light is not sufficiently transmitted through a pupil of the objective lens 310. The peripheral area SA may be a dark field having low light intensity. The light irradiated onto the peripheral area SA may increase a resolution of the plurality of circuit pattern layers 30.

Figure 8:
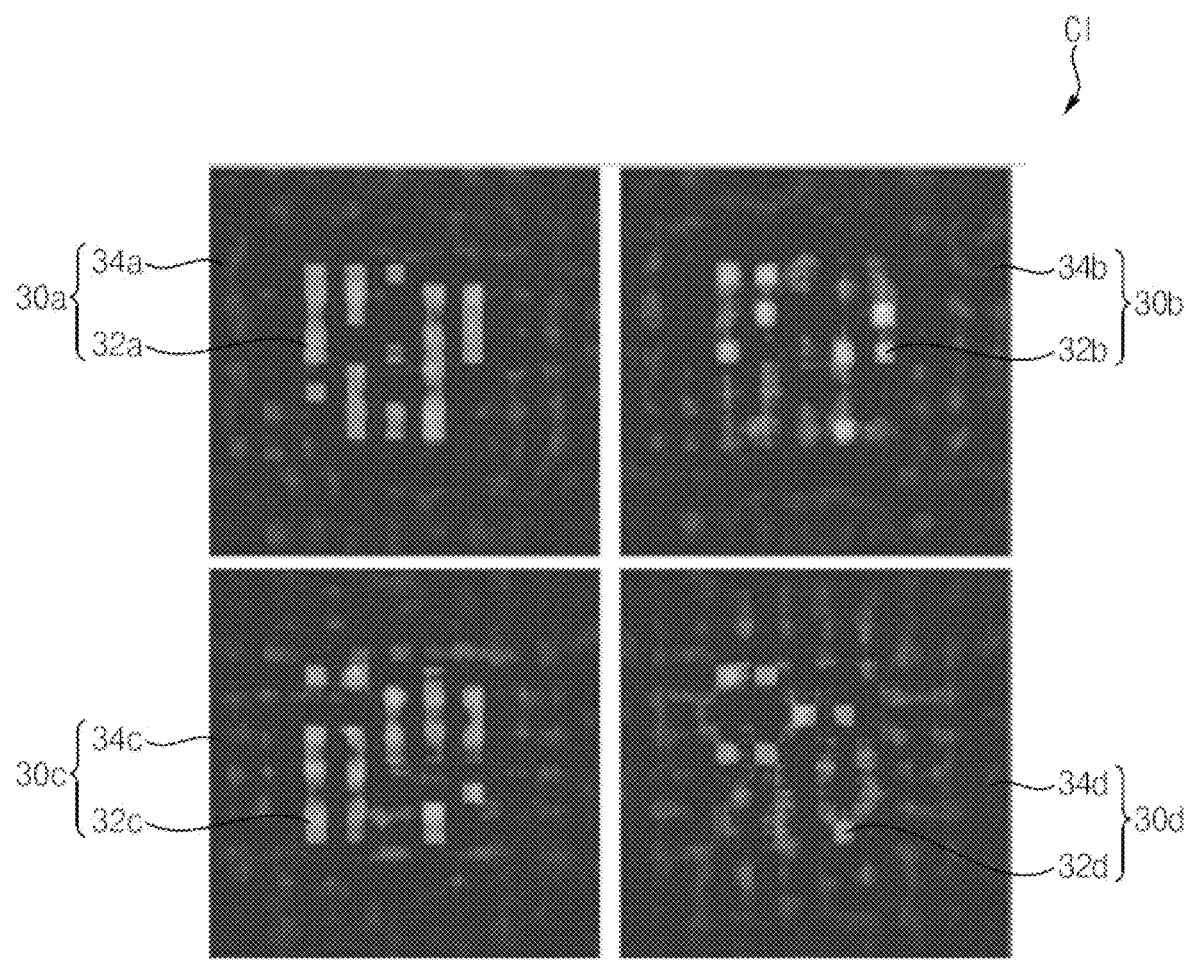

FIG. 8 is a view illustrating photographic images of a plurality of circuit pattern layers.

Referring to FIGS. 1 and 8, photographic images CI of the first to fourth circuit patterns 32a, 32b, 32c, and 32d may be obtained from the first and second reflected lights that are reflected from the illumination area LA and the peripheral area SA, respectively. An overlay between the circuit pattern layers 30 may be measured through the photographic images CI and the image models IM.

In example embodiments, the first reflected light reflected from the illumination area LA and the second reflected light reflected from the peripheral area SA may be collected to form the photographic images CI. The photographic images CI of the circuit pattern layers 30 may be obtained through the first and second reflected lights, respectively.

An amplitude and a phase may be obtained from the first and second reflected lights that are reflected from the illumination area and the peripheral area. The photographic images CI of the first to fourth circuit pattern layers 30a, 30b, 30c, and 30d may be obtained through the amplitude and the phase.

The photographic images CI may have a three-dimensional (3D) profile of each of the first to fourth circuit pattern layers 30a, 30b, 30c, and 30d. The three-dimensional profile may be calculated through the first and second reflected lights. The three-dimensional profile may be calculated through the light incident onto the semiconductor substrate 20 at the vertical direction and the light incident onto the semiconductor substrate 20 at the predetermined angle from the vertical direction. The circuit pattern layers 30 of the semiconductor substrate 20 may be recognized in a three-dimensional space through the three-dimensional profile.

Heights between the first to fourth circuit pattern layers 30a, 30b, 30c, and 30d may be measured from the first and second reflected lights. The photographic images CI may be obtained through the heights. The heights may be measured using the light incident onto the semiconductor substrate 20 at the vertical direction and the light incident onto the semiconductor substrate 20 at the predetermined angle from the vertical direction.

The overlay may be measured through the photographic images CI and the image models IM. A change (gradient) between the photographic images and the image models may be calculated. The change may be an error value between the photographic images and the image models. The change may be calculated through repeated comparison simulations. The change of each of the circuit pattern layers 30 of the semiconductor substrate 20 may be calculated.

The overlay between the first to fourth circuit pattern layers 30a, 30b, 30c, and 30d may be measured based on the change through gradient descent method. The gradient descent method may include an optimization algorithm configured to obtain the error value between the photographic images CI and the image models IM. The gradient descent method may include an algorithm configured to repeatedly obtain an approximate value of the change through the repeated comparison simulations. An extreme value of the approximate value may be obtained to measure the overlay through the gradient descent method.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A substrate inspection apparatus, comprising:
a light irradiator including an objective lens and a plurality of optical fibers, wherein the objective lens is configured to irradiate light to an illumination area on a semiconductor substrate having a plurality of circuit pattern layers, the plurality of optical fibers are adjacent a perimeter of the objective lens and are configured to irradiate the light to a peripheral area adjacent the illumination area;
a light generator configured to generate the light, wherein the light generator is configured to change an irradiation angle of the light to selectively irradiate the light to one or more of the objective lens and the plurality of optical fibers; and
a light analyzer configured to obtain images of the plurality of circuit pattern layers from the light reflected from the illumination area and the peripheral area, wherein the light analyzer is configured to model each of the plurality of circuit pattern layers of the semiconductor substrate to obtain image models and to measure an overlay between the plurality of circuit pattern layers with the images and the image models.

2. The substrate inspection apparatus of claim 1, further comprising:
a reflection mirror configured to reflect the light generated from the light generator to the objective lens or the plurality of optical fibers according to the irradiation angle.

3. The substrate inspection apparatus of claim 2, further comprising:
a first optical lens between the light generator and the reflection mirror configured to focus the light generated from the light generator onto the reflection mirror.

4. The substrate inspection apparatus of claim 1, further comprising:
a second optical lens between the light analyzer and the semiconductor substrate configured to focus the light reflected from the semiconductor substrate onto an image sensor of the light analyzer.

5. The substrate inspection apparatus of claim 1, wherein the light generator includes at least one of a spatial light modulator (SLM), an LED array, and a digital micro mirror device.

6. The substrate inspection apparatus of claim 1, wherein a numerical aperture of the objective lens is within a range of 0.1 to 0.3.

7. The substrate inspection apparatus of claim 1, wherein each of the optical fibers irradiates the light onto the semiconductor substrate at a predetermined angle from a direction perpendicular to a surface of the semiconductor substrate, and
the predetermined angle is within a range of 10 degrees to 50 degrees.

8. The substrate inspection apparatus of claim 1, wherein the light analyzer is configured to collect the light reflected from the illumination area and the light reflected from the peripheral area and is configured to acquire the images of the plurality of circuit pattern layers.

9. The substrate inspection apparatus of claim 1, wherein the light analyzer is configured to calculate a gradient between the images and the image models, and the light analyzer is configured to measure the overlay between the plurality of circuit pattern layers using a gradient descent method based on the gradient.

10. The substrate inspection apparatus of claim 1, wherein the light analyzer is configured to measure the overlay using an amplitude and a phase of the light reflected from the illumination area and the peripheral area.

11. The substrate inspection apparatus of claim 1, wherein the images have a three-dimensional profile of each of the plurality of circuit pattern layers.

12. The substrate inspection apparatus of claim 1, wherein the light analyzer is configured to measure a height for each of the plurality of circuit pattern layers from the light reflected from the illumination area and the peripheral area to obtain the images.

13. A substrate inspection apparatus, comprising:
a spatial light modulator configured to generate light while changing an irradiation angle;
an objective lens configured to irradiate the light to an illumination area onto a semiconductor substrate that has a plurality of circuit pattern layers;
a plurality of optical fibers adjacent a perimeter of the objective lens and configured to irradiate the light to a peripheral area surrounding the illumination area;
a reflection mirror configured to reflect the light generated from the light generator to the objective lens or the plurality of optical fibers according to the irradiation angle; and
a light analyzer configured to obtain images of the plurality of circuit pattern layers from the light reflected from the illumination area and the peripheral area.

14. The substrate inspection apparatus of claim 13, further comprising:
a reflection mirror configured to reflect the light generated from the light generator to the objective lens or the plurality of optical fibers according to the irradiation angle.

15. The substrate inspection apparatus of claim 14, further comprising:
a first optical lens between the light generator and the reflection mirror configured to focus the light generated from the light generator onto the reflection mirror.

16. The substrate inspection apparatus of claim 13, wherein further comprising:
a second optical lens between the light analyzer and the semiconductor substrate configured to focus the light reflected from the semiconductor substrate onto an image sensor of the light analyzer.

17. The substrate inspection apparatus of claim 13, wherein each of the optical fibers irradiates the light onto the semiconductor substrate at a predetermined angle from a direction perpendicular to a surface of the semiconductor substrate, and
the predetermined angle is within a range of 10 degrees to 50 degrees.

18. The substrate inspection apparatus of claim 13, wherein the light analyzer is configured to collect the light reflected from the illumination area and the light reflected from the peripheral area and is configured to acquire images of the plurality of circuit pattern layers.

19. The substrate inspection apparatus of claim 18, wherein the images have a three-dimensional profile of each of the plurality of circuit pattern layers.

20. A substrate inspection apparatus, comprising:
a light generator configured to generate light while changing an irradiation angle to measure an overlay of a semiconductor substrate that has a plurality of circuit pattern layers;
a light irradiator including an objective lens and a plurality of optical fibers, wherein the objective lens is configured to irradiate the light to an illumination area onto the semiconductor substrate, and the plurality of optical fibers are adjacent a perimeter of the objective lens and are configured to irradiate the light to a peripheral area adjacent the illumination area;
a reflection mirror configured to reflect the light generated from the light generator to the objective lens or the plurality of optical fibers according to the irradiation angle;
an optical lens between the light generator and the reflection mirror configured to focus the light generated from the light generator on the reflection mirror; and
a light analyzer configured to obtain images of the plurality of circuit pattern layers from the light reflected from the illumination area and the peripheral area, wherein the light analyzer is configured to model each of the plurality of circuit pattern layers of the semiconductor substrate to calculate image models, and the light analyzer is configured to measure the overlay through the images and the image models.

* * * * *